(12) United States Patent
Withers et al.

(10) Patent No.: US 7,701,217 B2
(45) Date of Patent: Apr. 20, 2010

(54) NMR SPIRAL RF PROBE COIL PAIR WITH LOW EXTERNAL ELECTRIC FIELD

(75) Inventors: Richard S. Withers, Sunnyvale, CA (US); Robert E. Nast, Saratoga, CA (US); Weston A. Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 12/187,691

(22) Filed: Aug. 7, 2008

(65) Prior Publication Data

US 2010/0033184 A1 Feb. 11, 2010

(51) Int. Cl.
*G01V 3/00* (2006.01)

(52) U.S. Cl. ....................... 324/318; 324/322
(58) Field of Classification Search .......... 324/318, 324/322
See application file for complete search history.

(56) References Cited

U.S. PATENT DOCUMENTS

| | | | | |
|---|---|---|---|---|
| 4,398,149 | A * | 8/1983 | Zens | 324/319 |
| 4,636,730 | A * | 1/1987 | Bottomley | 324/322 |
| 4,743,852 | A * | 5/1988 | Ikeda | 324/318 |
| 5,050,605 | A * | 9/1991 | Eydelman et al. | 600/422 |
| 5,276,398 | A | 1/1994 | Withers et al. | |
| 5,565,778 | A | 10/1996 | Brey et al. | |
| 5,818,232 | A * | 10/1998 | Mehr et al. | 324/318 |
| 6,587,706 | B1 * | 7/2003 | Viswanathan | 600/410 |
| 6,590,394 | B2 * | 7/2003 | Wong et al. | 324/318 |
| 2008/0150536 | A1 | 6/2008 | Withers | |

OTHER PUBLICATIONS

Wei-Hao Chang, et al., "Single-sided mobile NMR with a Halbach magnet", ScienceDirect, Magnetic Resonance Imaging 24, 2006, pp. 1095-1102.

B.H. Suits, et al., "Noise-Immunie Coil for Unshielded Magnetic Resonance Measurements", Journal of Magnetic Resonance 131, Article No. MN971335, 1998, pp. 154-158.

* cited by examiner

*Primary Examiner*—Louis M Arana
(74) *Attorney, Agent, or Firm*—Bella Fishman

(57) ABSTRACT

RF electric fields produced by electric potential differences in NMR probe coil windings may penetrate the NMR sample and sample tube causing sensitivity loss and noise in NMR spectroscopy. Counter-wound spiral coils placed on the opposite surfaces of a planar substrate or on two adjacent planar substrates produce electric potentials that minimize the electric field over the sample region, thereby increasing the sensitivity of the NMR probe. Alternatively counter-wound spiral coils placed adjacent to each other on the outer surface of two concentric cylindrical surfaces that surround the NMR sample minimize the electric field over the sample region. The electric potential of the spiral coils is reduced by adjusting a length of at least one coil.

19 Claims, 7 Drawing Sheets

NMR SPIRAL RF PROBE COIL PAIR WITH LOW EXTERNAL ELECTRIC FIELD

FIELD OF THE INVENTION

This invention relates to nuclear magnetic resonance (NMR) and in particular to RF probe coil geometries that provide a strong RF magnetic field with a minimum of RF electric field over the sample volume.

BACKGROUND OF THE INVENTION

NMR is a powerful technique for analyzing molecular structure. However it is also an insensitive technique compared to others for structure determination. To gain maximum sensitivity, NMR magnets and spectrometers are designed to operate at high magnetic field strengths, employ low noise preamplifiers and RF probe coils that operate at cryogenic temperatures using cold normal metal transmit/receive coils or preferably transmit/receive coils made with high temperature superconducting (HTS) materials. The transmit/receive coils are the probe coils that stimulate the nuclei and detect the NMR response from the sample, and therefore are placed very close to the sample to provide high sensitivity. The HTS coils have the highest quality factor, Q, and yield the best sensitivity. Multi-turn spiral coils are commonly used to detect the NMR signal, particularly for lower gamma nuclei such as $^{13}C$, $^{15}N$ and $^{31}P$. The electric fields from the turns of the spiral coils near the sample may penetrate the sample and cause dielectric losses and increased noise. The electric fields penetrating the sample also cause detuning of the coil and a resonant frequency that is a function of the dielectric constant and position of the sample. In spinning samples, this detuning can lead to spurious spinning sidebands.

When the RF current flows through the windings of the NMR probe coil, an RF magnetic field is produced in the sample region that stimulates the resonance in the sample. This RF magnetic field, B, has an associated RF electric field, E. This RF electric field, E, can be calculated utilizing the Maxwell equation:

$$\text{curl } E = -dB/dt.$$

To minimize losses from this RF electric field, NMR probes are designed so that the sample is in a region where this RF electric field is a minimum, or passes through zero.

There is another component of electric field that is caused by the electric potential between the windings of an RF coil. This, so-called, conservative electric field arises from the electric potential differences of the turns of the RF coil winding. This component of electric field, Ec, obeys the condition:

$$\text{curl } Ec = 0.$$

It is called an electrostatic field since it does not require any time derivatives to produce it. When this component of electric field penetrates the sample or sample tube it can cause energy losses. During transmit and during spin decoupling experiments these losses can cause undesired heating of the sample. During the receive phase, the currents induced by the NMR signal also produce an electric potential between turns of the RF probe coil, causing electric fields to penetrate the sample volume resulting in a loss of Q and reduced sensitivity. Since the sample is usually at or near room temperature and the probe coil is at a very low temperature, noise power is also introduced into the RF probe coil through this electric field coupling. This loss is proportional to the electric field coupling between the sample and the RF probe coil and depends upon the dielectric loss tangent or dissipation factor of the sample and sample tube material and the electrical conductivity of ionic samples.

Small changes in the strength or direction of the DC magnetic field applied to the probe or other magnetic field fluctuations induce small shielding currents in the surface of the superconductor films of the spiral coils. These shielding currents can cause magnetic field inhomogeneity in the sample region resulting in line broadening and loss of NMR sensitivity. (U.S. Pat. No. 5,565,778). To reduce the shielding currents the coil turns may be slit in the direction parallel to that of the RF current flow thereby reducing size of the shielding current loops. Each turn of the spiral coil may be split into a number of parallel conductors or "fingerlets" with a small insulating gap between fingerlets.

Electrostatic shields have been used in the prior art to reduce this electric field. (US Patent Publication No. 2008/0150536). The task of reducing the electric filed in the region of the sample is very important, and therefore there is a need to find an alternative method and apparatus. Existing technology does not utilize the counter-wound spiral coils to minimize the electric field in the region of the sample.

Spiral wound coils have been used before as a surface coil for MRI measurements when it was desired to keep the coil small, and yet be able to tune it to a low frequency (U.S. Pat. No. 5,276,398). It was proposed to use a pair of circular counter-wound coils with capacitive coupling between them for MRI applications to achieve a lower resonant frequency than could be achieved with a single coil. The teaching of this art did not consider or contemplate reducing the electric field over the sample region.

RF coils for high resolution NMR probes must be precisely tuned to the NMR resonant frequency of the nucleus being studied. For maximum sensitivity the electric field from the probe RF coils must produce a minimum electric field in the sample region. The coils are tuned to resonate in the RF frequency range of the nuclear species being studied. The probe is tuned by adjusting the total coil length of wire used to wind the coils. Fine tuning is provided by a variable capacitor or by a wand that provides small adjustable changes to the resonator inductance.

Therefore there is a need in providing the RF probe coils of certain geometries, which are characterized by a strong RF magnetic field with substantially reduced RF electric filed over the sample volume.

SUMMARY OF THE INVENTION

The present invention provides an NMR probe coil that allows for producing lower electric field components over an NMR sample region. The NMR probe incorporates two sets of counter-wound spiral coil pairs. Each pair of spiral coils are wound on opposite sides of a dielectric layer, with both spirals having a rectangular or oval shape to match that of the desired active sample volume. Two sets of counter-wound spiral coils are used, one on each side of the sample. The two spiral coils of each set are counter-wound, i.e. the two coils are wound in opposite directions, one being wound clockwise and the other counter clockwise when moving from inside the spiral to the outside. The two sets of coil pairs are driven from a common coupling loop. In its lowest mode of resonance, the current flow in the four spiral coils will be in the same angular direction at a given moment of time, producing a large RF magnetic field in the sample volume adjacent to the coils. As a result of the opposite "handedness," of each coil of a set, the electric potential will be negative on the inside of one spiral and positive on its outside, while the potential on the other spiral coil of the set will be positive on its inside and negative on its outside. By adjusting the relative length of each coil of a spiral coil pair, the electric field from one spiral coil of a pair can produce an equal-but-opposite spatial distribution of potential, resulting in an electric field that is well confined to the dielectric-filled space between the spirals and minimizing the electric field in the sample region.

The relative strength of the electric field from each spiral coil is sensitive to the coil length. The electric fields are oppositely directed in the sample region. Thus the relative electric field strength of each coil of a spiral coil pair may be adjusted by changing the relative length of each spiral coil to minimize the electric field strength in the sample region. The lowest resonant frequency of a spiral coil pair also depends upon the total length of the two spiral coils. Starting with a sufficient winding length, the ends of the spiral coils may be selectively cut to simultaneously tune the coil pair to the desired NMR frequency and at the same time reduce the external electric field in the sample region produced by the counter-wound spiral coil pair.

HTS coils are normally adjusted using a laser trimmer to make the cut. In some configurations of counter-wound spiral coil pairs the coil ends may overlap causing difficulties when attempting to tune the individual coils by laser trimming. When cutting a turn or fingerlet of the coil, the laser beam may also pass through the substrate to the coil on the other side making a destructive cut in this coil. To overcome this problem, a material that adsorbs or scatters the laser beam is introduced between the two coils of the counter-wound coil pair.

It is preferable to cut all of the fingerlets across the coil turn when being trimmed for adjusting the winding length of it. If some of the fingerlets are cut and other adjacent fingerlets of the same turn are not cut and having shorter ends, an arc may occur between the shorter end fingerlet and a neighboring fingerlet, when transmitted power is applied to the coil. To prevent such an occurrence, the entire shorter end fingerlet may be removed.

BRIEF DESCRIPTION OF THE DRAWINGS

The forgoing aspects and advantages of the present invention will become better understood by reference to the following detailed description when taken in conjunction with the accompanying drawings.

DETAILED DESCRIPTION OF THE INVENTION

In this work the embodiments are disclosed for HTS probe coils, cooled normal metal coils, and room temperature NMR probe coils. Contemporary HTS coils need to be cooled as they lose their superconducting properties at room temperature. The coils made of normal metal may be cooled or operated near room temperature.

Figure 1B:
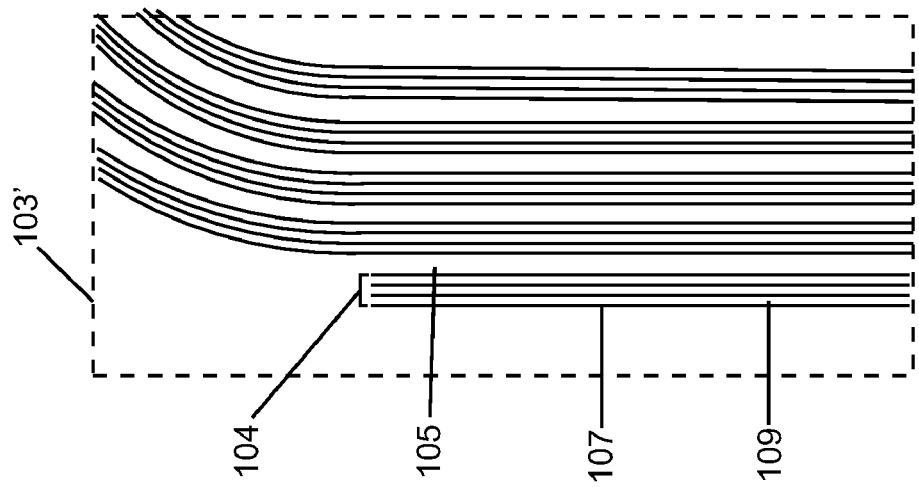
FIG. 1B is an illustration of fingerlets of HTS coils.
Figure 1A:
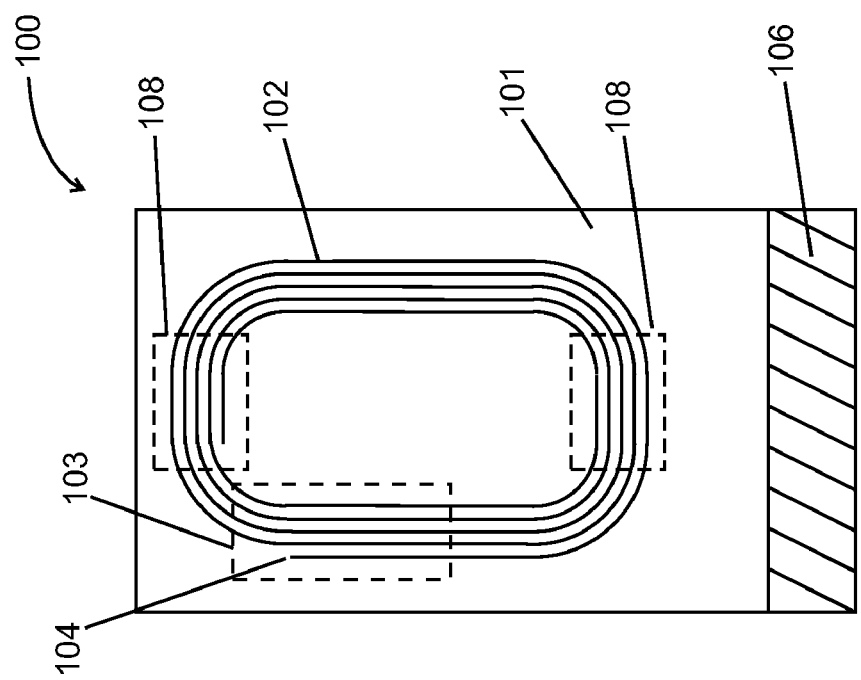
FIG. 1A is a view of a prior art HTS NMR probe coil fixed to a dielectric substrate.

FIG. 1A depicts a prior art HTS NMR probe coil assembly 100 that provides the RF field to the sample thereby stimulating the nuclear spins and then receiving the response of the nuclear spins in the sample. Typically the coil winding 102 is composed of a high temperature superconducting (HTS) material such as yttrium barium copper oxide (YBCO). The HTS material may be sputtered, evaporated, or otherwise deposited upon an electrically insulating planar substrate 101 such as sapphire. Typically the supporting substrate may be 400 micrometers thick and the HTS material 0.3 micrometers thick. Each turn of the coil may be composed of a number of parallel channels, or "fingerlets" of the HTS material. The section enclosed by box 103 is enlarged and displayed in box 103' of FIG. 1B.

FIG. 1B depicts how each turn of coil 102 is split into a number of parallel conductors or fingerlets 107. The spacing between adjacent turns, 105, is typically in the range of 30 to 100 micrometers. The purpose of the fingerlets is to prevent any external magnetic fields from inducing small persistent current loops in the windings causing the distortion of the magnetic field homogeneity over the sample region. The spacing between fingerlets, 107 may be in the range of 10 micrometers and the width of each fingerlet in the range 0 to 20 micrometers.

For NMR applications two probe coils are used, one on each side of the sample tube. The substrate supporting each coil is attached to the heat exchanger in region 106 (FIG. 1A). The heat exchanger (143 shown in FIG. 4) provides the cooling and temperature control of probe coil assemblies 100. A coupling loop (154 of FIG. 4) is inductively coupled to the coil windings and is electrically connected to the NMR spectrometer. It couples the RF energy to the coil to excite NMR resonance and it receives the response induced into the coil from the sample material and transmits it to the spectrometer for processing, recording and display.

In the HTS NMR probe the sample tube is typically a cylindrical tube with the long axis of the tube parallel to each face of the planar substrates 101. The sample tube passes very close to the coil windings 102 in the regions indicated by the doted boxes 108 of FIG. 1A. In this region the potential differences between adjacent and nearby windings produce electric fields that penetrate the nearby sample tube and NMR sample causing energy loss and a reduction of sensitivity as described above.

Figure 2A:
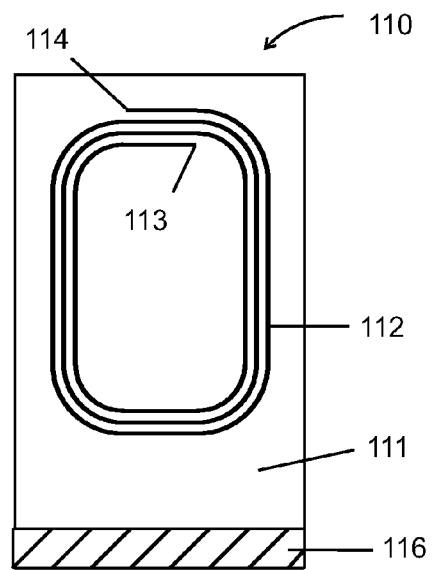
FIG. 2A is a view of the first spiral coil of a spiral wound coil pair.
Figure 2B:
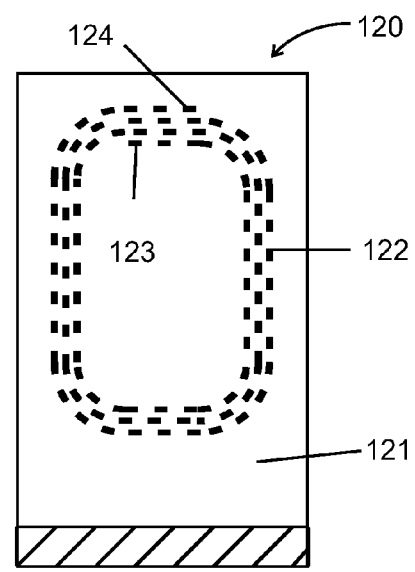
FIG. 2B is a view of the second spiral coil of the spiral wound coil pair when seen from the same direction as the first spiral coil of FIG. 2A.

FIGS. 2A and 2B depicts the two spiral wound coils that form a spiral counter-wound coil pair. In operation, the two coils of the coil pair are placed on opposite sides of dielectric substrate 111. Spiral coil 112 of FIG. 2A formed on dielectric substrate 111 and is wound counter-clockwise starting from the inside end 113 to the outer end 114. Spiral coil 122 of FIG. 2B formed on dielectric substrate 121 and is wound clockwise starting from the inside end 123 to the outer end 124.

Figure 2C:
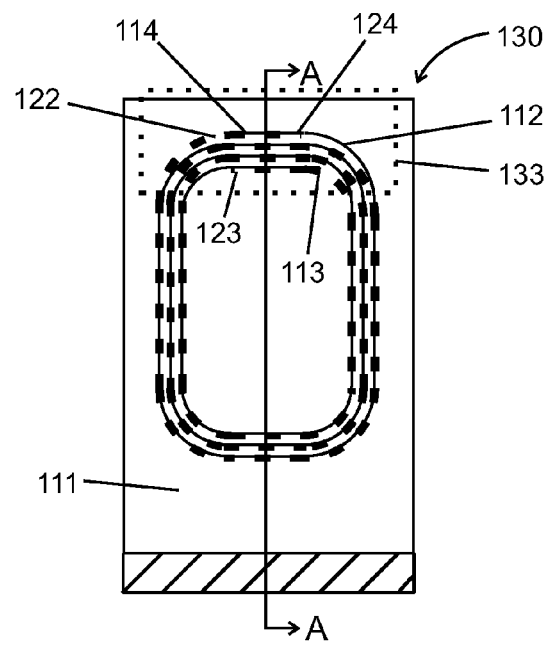
FIG. 2C is a view of the two coils of a spiral wound coil pair as seen from the face of the coil pair, illustrating the counter-wound feature of the two coils.

FIG. 2C depicts a front view with the two spiral counter-wound coils 112 and 122 in place adjacent to each other with turns closely aligned, with coil 112 forming a counter-clockwise and coil 122 forming a clockwise spiral moving from the inside ends to the outside ends. The two coils may be clamped or glued together to give a monolithic structure. Each of the coils, 112 and 122 may be composed of a number of fingerlets, typically between 4 and 30 fingerlets per turn. Breaking the coil into a number of fingerlets reduces any magnetization induced in the turns by external magnetic fields.

In a preferred embodiment an additional laser light blocking material is placed between coils 112 and 122. In one embodiment the light blocking material is placed in the region outlined by dotted line 133 of FIG. 2C. The light blocking material should cover the region where either inner coil ends, 113 and 123, or the outer coil ends 114 and 124, or both, are located. This may be at the top of the coil as illustrated in FIG. 2C, or where ever the ends of the coil are located, which may be on the bottom or a side of the coils.

When trimming the coil 112 to adjust the external electric field or the resonant frequency of the coil pair, the light blocking material in region 133 prevents light from the laser trimmer against cutting parts of coil 122 that is located directly behind the region on coil 112 that is being trimmed. Conversely when trimming coil 122, the light blocking material prevents parts of coil 112 from being damaged.

FIG. 3A, 3B, 3C, 3F illustrate different spiral coil and substrate arrangements that provide low external electric fields according to the subject invention. They correspond to various coil and dielectric substrate arrangements that give the counter-wound spiral coil pairs a low external electric field. They all have the same projection as seen in FIG. 2C and correspond to different coil/substrate arrangements as seen when viewed by taking a cross section cut A-A through FIG. 2C.

Figure 3E:
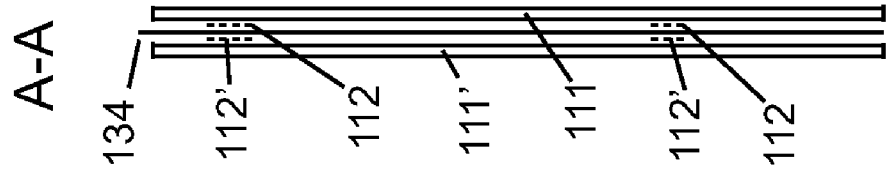
FIGS. 3A-E are sections A-A of FIG. 2C illustrating various coil arrangements according to different aspects of the invention.
Figure 3D:
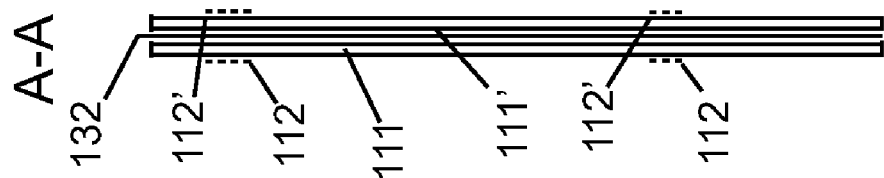
Figure 3C:
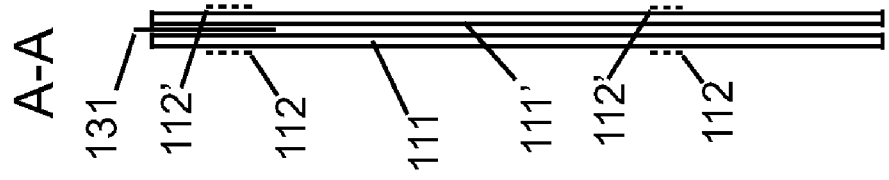
Figure 3B:
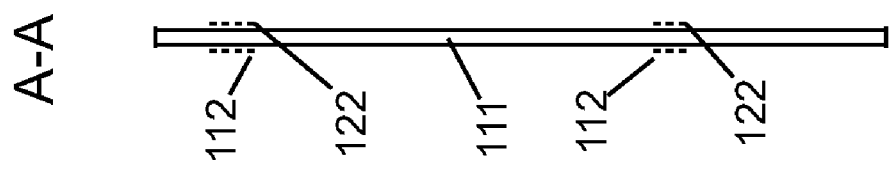
Figure 3A:
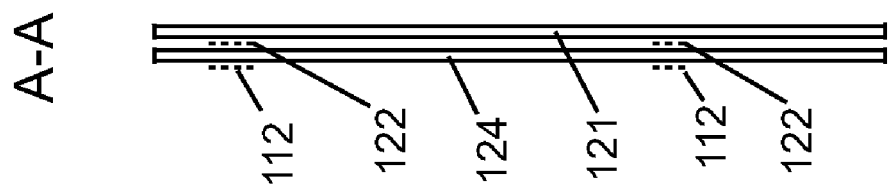

In FIG. 3A substrate 121 with coil 122 of FIG. 2B are clamped or glued directly to the back of substrate 111 spiral coil 112 of FIG. 2A. These spiral coils may be laser trimmed while they are separated, and then clamped together in their final configuration when checking their frequency and external electric field. When mounting a set of two of these pairs in a probe, the preferred coil orientation is with the substrate face supporting a coil to be placed closest to the sample. It is also preferred that the two coils nearest the sample tube have the same "handedness".

In section A-A of FIG. 3B spiral coil 122 is formed directly on the second side of substrate 111, of FIG. 2A with its spiral coil 112 on the first side of substrate 111. This arrangement provides a very rugged and compact counter-wound spiral coil pair. For coils directly bonded to the two sides of the same substrate a suitable dielectric substrate material must be chosen. When using HTS coils the dielectric substrate must not only support the coils and have good thermal properties to enable suitable cooling, but must also block the laser light to prevent it from damaging the coil on the opposite side.

In the arrangements illustrated by FIGS. 3C, 3D and 3E, two identical spiral coils are used. The oppositely wound spiral coil are assembled from two identical coils mounted on separate dielectric sheets, with the second sheet rotated by 180 degrees about its vertical axis. If the first coil 112 is wound in a counter-clockwise manner as illustrated in FIG. 2A the second coil, when viewed through substrate will be wound clockwise starting from the center in both cases. A separate light blocking material is positioned next between the two spiral coils of a counter-wound pair to prevent laser light from damaging one spiral coil while trimming the other.

In FIG. 3C a dielectric sheet of laser light blocking material 131, that either absorbs or scatters the laser light, is inserted between the two coils 112 and 112' in the region indicated by 133 of FIG. 2C. The two substrates 111 and 111' of FIG. 3C are then glued together, introducing the glue from the edge. Alternatively the two substrates 111 and 111' may be clamped together. A laser light blocking material 131 that works by scattering the light is 0.001 to 0.003 inch thick Teflon® sheet. Epoxy has been found to be an effective glue.

FIG. 3D illustrates an embodiment with the entire region between the two substrates 111 and 111' is covered by the laser light blocking material 132 and then clamped or glued.

FIG. 3E illustrates another alternative arrangement. In this case the two substrates 111 and 111' are glued or clamped with the coils facing each other. An insulating layer 134 placed between them prevents the coils 112 and 112' from touching and shorting and provides an optical barrier to the laser light. By choosing material and thickness of insulating layer 134 the capacitance between the two coils may be controlled as well as forming an optical barrier to the laser light.

In each of these embodiments FIGS. 3A through 3E the front projection of the spiral wound coil assembly appear as indicated in FIG. 2C with spiral coil 112 is wound counter-clockwise moving from the inside coil end to the outside end, and spiral coils 122 or 112' are wound clockwise from inside end to outside end or visa versa.

If one end of a first coil is located on either the left or right side of the coil (as opposed to the top or bottom of the coil), an counter wound spiral coil may be formed from by a 180 degree rotation about a horizontal axis. The counter wound coil must then be correctly positioned to overlap with the first coil.

Figure 4:
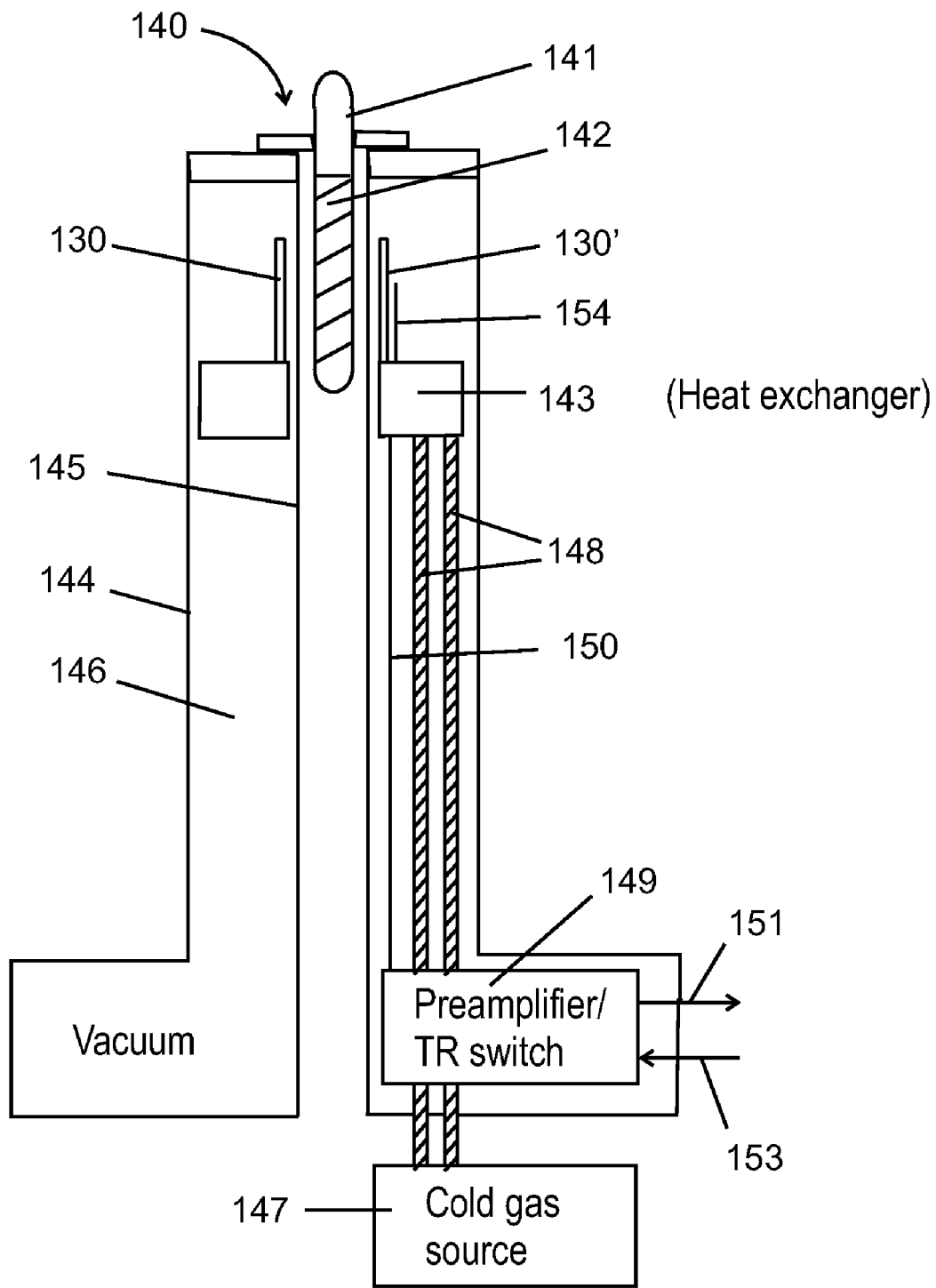
FIG. 4 is a block diagram depicting a cryogenically cooled NMR probe utilizing two sets of counter-wound spiral coil pairs of the subject invention.

The NMR probe incorporates two sets of these counter wound coil pairs, one set on each side of the sample region illustrated by 130 and 130' of FIG. 4. Each of the arrangements of FIG. 3A-3E is different embodiment of the subject invention.

FIG. 4 is a block diagram of a cryogenically cooled probe 140 with sample tube 141 and NMR sample 142. The probe 140 has an outer shell 144 made of non-ferromagnetic material such as aluminum and an inner dielectric tube 145 made of fused quartz, for example. The outer shell 144 and dielectric inner tube 145 form a vacuum tight space 146. This space is evacuated providing good thermal insulation of the cold coil pairs 130 and 130' and the warm sample 142 and sample tube 141. Two counter wound spiral coil pairs, 130 and 130' are identical and are mounted on opposite sides of sample tube 141, and each is in thermal contact with heat exchanger 143. Heat exchanger 143 surrounds inner tube 145 thereby providing cooling to both coil pairs 130 and 130'. Cooling for the spiral-wound coils is provided by cold gas source 147. The HTS counter-wound spiral coil pairs 130 and 130' are typically cooled to a temperature in the range of 20 K. The cold gas flows to and from heat exchanger 143 by cold gas transfer tubes 148. The tube supplying the cold gas from cold gas source 147 is thermally insulated from the preamplifier and T/R (Transmit/Receive) switch 149, while the tube returning the partially spent gas is in thermal contact with the preamplifier and T/R switch 149, thereby cooling it to a low temperature typically in the range of 80 K. Alternatively two cold gas coupling loops may be used, one to cool the spiral wound coils 130 and one to cool the preamplifier and T/R switch 149.

An RF probe cable 150 transmits RF power to the spiral wound coils 130 and 130' via coupling loop 154 and receives the NMR response signals and transmits them to the preamplifier and T/R switch 149. The preamplifier and T/R switch receive transmit power from the spectrometer (not shown) via cable 153 and send the amplified NMR signal to the spectrometer (not shown) on cable 151.

Figure 5A:
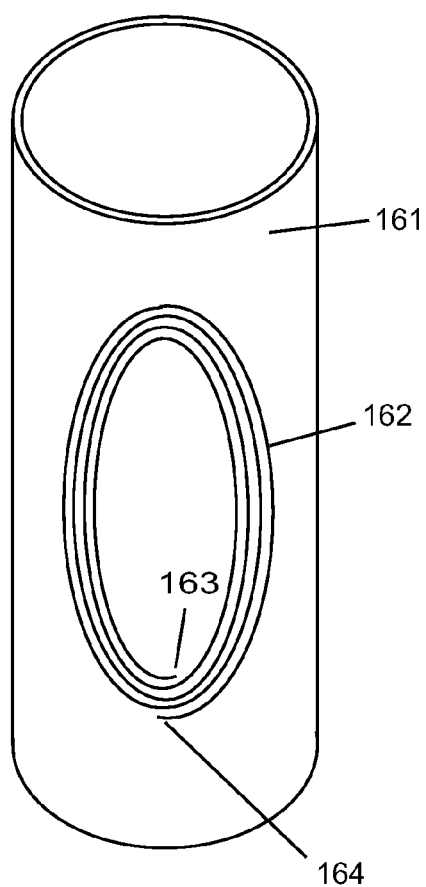
FIG. 5A is a view of the first spiral coil of a spiral wound coil pair fixed to the outside surface of a cylindrical dielectric member.

FIG. 5A illustrates a spiral coil 162 fixed to the outer surface of a cylindrical dielectric coil form 161. The winding extends from the inside end of the spiral 163 winding clockwise to the outside end 164. The coil winding is composed of HTS material or a normal metal such as copper or aluminum, in the form wire or preferably thin strip conductors. The strips may be composed of two or more layers of different metals to produce a strip that has near-zero magnetic susceptibility. The coil may be operated at a low temperature for HTS coils or at room temperature or below room temperature for normal metal coils.

Figure 5B:
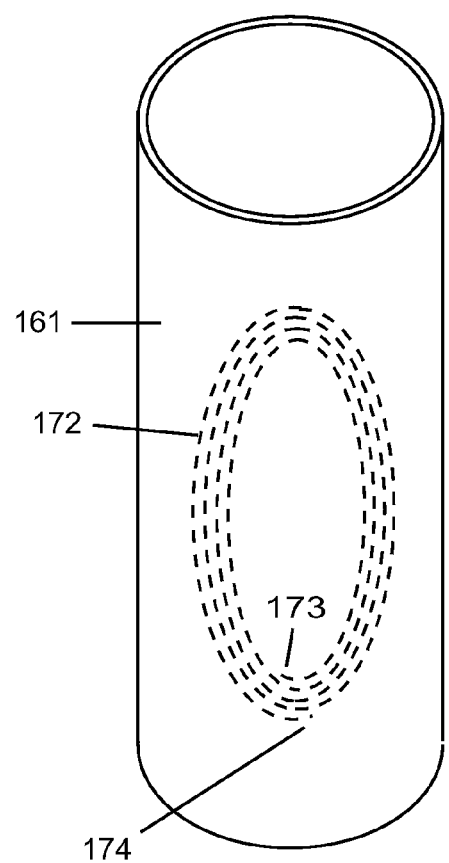
FIG. 5B is a view of the second spiral coil of a spiral wound coil pair fixed to the inside surface of the same cylindrical dielectric member shown in FIG. 5A.

As illustrated in FIG. 5B, a counter-wound coil 172 is fixed to the inside surface of the same coil form 161 with spiral coil 162 not shown for sake of clarity. This winding extends from the inside end 173 of spiral 172 winding counter clockwise to the outside end 174. This coil is closely adjacent to coil 162, which is on the outer surface of coil form 161. The coil 162 and coil 172 form a counter wound spiral coil pair.

Figure 6:
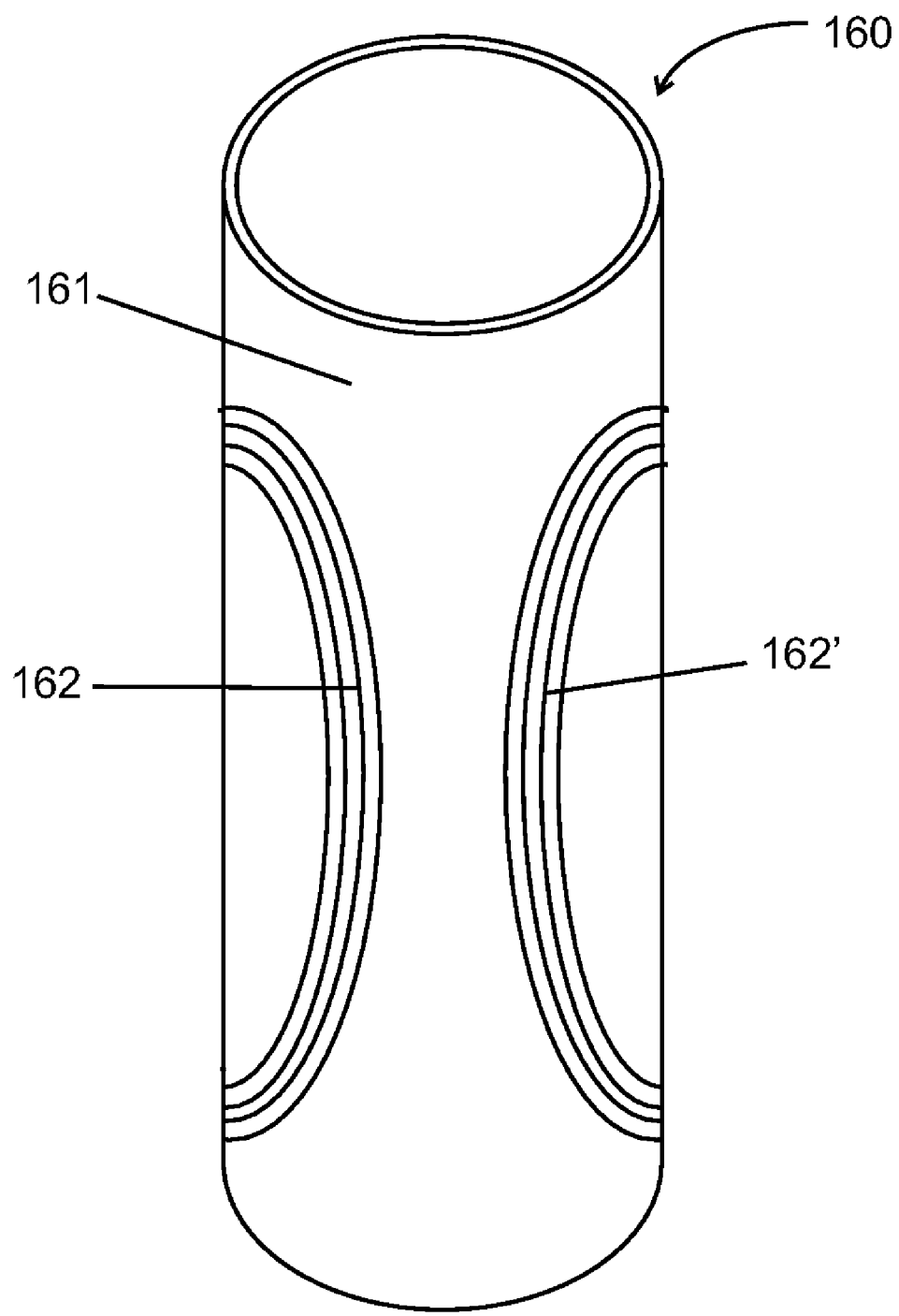
FIG. 6 is a view of two sets of spiral wound coil pairs showing only the spiral wound coils fixed to the outside surface a cylindrical dielectric member.

A second set of a counter wound coil pair is placed on the same coil form, but on the opposite side of coil form 161. Coil assembly 160 of FIG. 6 is a view of the two coils 162 and 162' on the outer surface of coil form 161. Both coils 162 and 162' have a counter wound coils 172 and 172' (not shown) on the inside surface of coil form 161, directly adjacent to coils 162 and 162' forming two sets of counter-wound spiral coil pairs.

In operation the coil assembly 160 of FIG. 6 is inductively coupled to the spectrometer in the manner as illustrated in FIG. 4 by coils 130 and 130'. Final tuning of the coils of assembly 160 is done by machining or mechanically cutting the ends of the individual coils to achieve the correct frequency and potential balance to achieve minimum electrostatic coupling to the sample and sample tube.

Figure 7A:
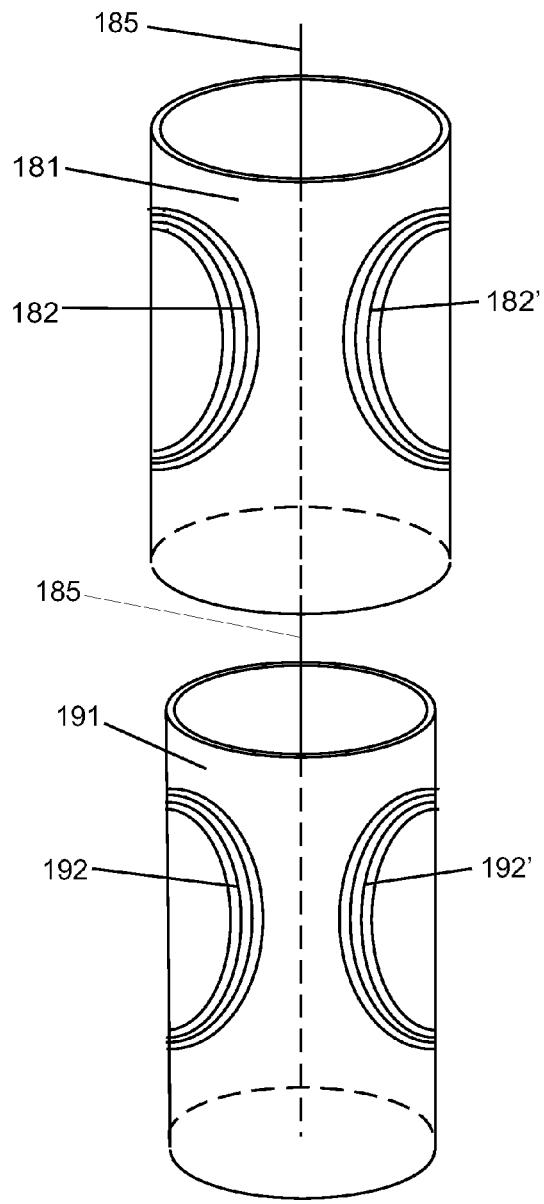
FIG. 7A is a view of two sets of counter-wound spiral coil pairs, with one coil of each set fixed to the outside surfaces of an outer cylindrical dielectric member and the second coil of each set fixed to the outer surface of a co-axial inner cylindrical dielectric member.

FIG. 7A is an alternative configuration of two sets of counter-wound spiral coil pairs mounted on a cylindrical dielectric coil forms 181 and 191. One coil of each set, 182 and 182', is mounted on the outside surface of coil form 181. The second coil of each set, 192 and 192', is mounted on the outside surface of the second coil form 191. FIG. 7A shows the two dielectric coil forms axially aligned with common axis 185. When wound, the second coil form, 191, slides snugly into coil form 181, with coils 182 and 192 overlapping to form one counter-wound spiral coil set and coils 182' and 192' forming the second counter-wound spiral coil set.

Figure 7B:
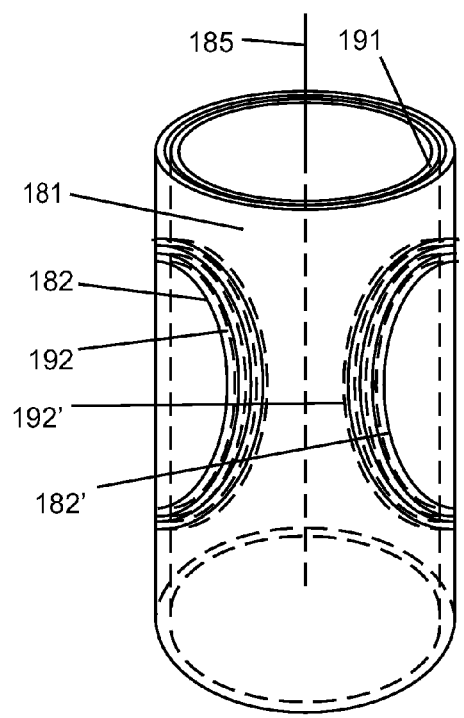
FIG. 7B is a view with the two cylinders of FIG. 7A fixed in final position.

FIG. 7B illustrates the assembled coil, ready for mounting in the probe. The counter-wound coil pair 182, 192 is mounted in the position illustrated by 130 of FIG. 4, and the counter-wound coil pair 182', 192' is mounted in the position illustrated by 130' of FIG. 4. The coils may be tested for their resonant frequency and electric field in the region of the sample tube 141 and sample 142. Should trimming be needed the coils may be removed and the coil leads cut with a mechanical cut-off tool, a laser cutter, or a scalpel. The coils may then be reassembled for further testing or final installation in a probe.

What is claimed is:

1. An NMR probe incorporating two sets of counter-wound RF spiral coils forming a sample region therebetween for exciting and detecting NMR signals from a sample positioned within the sample region, each set of said counter-wound RF spiral coils comprising:
    a pair of spiral coils, each spiral coil being wound in opposite angular directions relative to each other when moving from an inside of a respective spiral to its outside; and
    a dielectric member spacing apart said spiral coils,
    wherein an electric field induced within the sample region by electric potential of said spiral coils is reduced by adjusting a length of at least one of said spiral coils.

2. The NMR probe of claim 1, wherein said dielectric member is a planar substrate.

3. The NMR probe of claim 2, wherein one spiral coil of said pair is placed on one side and the other spiral coil is placed on an opposite side of said planar substrate.

4. The NMR probe of claim 3, wherein each said spiral coil of said pair is fabricated from HTS material.

5. The NMR probe of claim 4, wherein said planar substrate comprises a laser light blocking material.

6. The NMR probe of claim 3, wherein each said spiral coil of each pair is fabricated from normal metal.

7. The NMR probe of claim 1, wherein said dielectric member comprises a cylindrical member with said pairs of spiral coils disposed thereon.

8. The NMR probe of claim 7, wherein said spiral coils are fabricated from normal metal.

9. The NMR probe of claim 7, wherein said spiral coils are fabricated from HTS material.

10. The NMR probe of claim 7, wherein one spiral coil of each said pair is disposed on an outside surface of said cylindrical member and the other spiral coil of each said pair is disposed on an inside surface of said cylindrical member.

11. The NMR probe of claim 1, wherein said dielectric member comprises an outer and an inner coaxial cylindrical members with said pairs of spiral coils disposed thereon.

12. The NMR probe of claim 7, wherein one spiral coil of each said pair is disposed on the outside surface of said outer cylindrical member and the other spiral coil of each said pair is disposed on the outside surface of said inner cylindrical member, whereby said coil pairs are straddling the sample region.

13. A method of reducing an electric field of spiral RF coils pairs of NMR probe and tuning them to a resonant frequency of a NMR sample, the method comprising the steps of:
    providing two pairs of counter-wound RF spiral coils with spiral coils of each pair being wound in opposite angular directions relative to each other when moving from an inside of a respective spiral to its outside and being deposited on a dielectric member;
    placing the pairs of counter-wound spiral coils within a sample region to straddle the sample;
    measuring the electric field within the sample region; and
    reducing the electric filed by adjusting the length of at least one spiral coil.

14. The method of claim 13, further comprising the step of manufacturing the counter-wound RF spiral coils from HTS material.

15. The method of claim 14, wherein the dielectric member is a planar substrate comprising a laser light blocking material and each coil of the pair of counter-wound coils is mounted on opposite sides of the planar substrate.

16. The method of claim 15, further comprising the step of adjusting the length of at least one spiral coil by cutting the spiral utilizing a laser trimmer.

17. The method of claim 13, further comprising the steps of: manufacturing the spiral coils from normal metal, and adjusting the length of at least one spiral coil by cutting the spiral utilizing a scalpel or a mechanical cut-off tool or a laser trimmer.

18. The method of claim 17, wherein the dielectric member is a cylindrical member having disposed on its outside surface one spiral coils of each said pair and on its inside surface the other spiral coil of each said pair.

19. The method of claim 17, wherein the dielectric member comprises an outer and an inner coaxial cylindrical members having one spiral coil of each said pair disposed on an outside surface of the outer cylindrical member and the other spiral coil of each said pair disposed on the outside surface of the inner cylindrical member, whereby said coil pairs are straddling the sample region.

* * * * *